US009191744B2

(12) United States Patent
Anderson

(10) Patent No.: US 9,191,744 B2
(45) Date of Patent: Nov. 17, 2015

(54) INTELLIGENT AMBIENT SOUND MONITORING SYSTEM

(75) Inventor: Jeffrey Steven Anderson, Camas, WA (US)

(73) Assignee: Logitech Europe, S.A., Lausanne (CH)

( * ) Notice: Subject to any disclaimer, the term of this patent is extended or adjusted under 35 U.S.C. 154(b) by 689 days.

(21) Appl. No.: 13/571,093

(22) Filed: Aug. 9, 2012

(65) Prior Publication Data

US 2014/0044269 A1 Feb. 13, 2014

(51) Int. Cl.
*H03G 3/20* (2006.01)
*H04R 5/04* (2006.01)
*H04R 1/10* (2006.01)

(52) U.S. Cl.
CPC ................ *H04R 5/04* (2013.01); *H04R 1/1083* (2013.01); *H04R 2420/01* (2013.01); *H04R 2460/01* (2013.01)

(58) Field of Classification Search
CPC .... H04R 5/04; H04R 1/1083; H04R 2420/01; H04R 2460/01
USPC ..................... 381/57, 56, 94.1, 104, 106, 107
See application file for complete search history.

(56) References Cited

U.S. PATENT DOCUMENTS

| | | | | |
|---|---|---|---|---|
| 5,182,774 | A | 1/1993 | Bourk | |
| 6,278,786 | B1 | 8/2001 | McIntosh | |
| 7,567,677 | B1 | 7/2009 | Chan et al. | |
| 8,150,044 | B2 | 4/2012 | Goldstein et al. | |
| 2008/0267416 | A1 * | 10/2008 | Goldstein ............ | H04R 1/1091 381/56 |

* cited by examiner

*Primary Examiner* — Paul S Kim
(74) *Attorney, Agent, or Firm* — Patent Law Office of David G. Beck

(57) ABSTRACT

A system and method for interjecting ambient background sounds into a set of headphones is provided. The system monitors an ambient sound environment and compares the ambient sound environment to a preset set of sound characteristics (e.g., frequency signatures, amplitudes and durations) in order to detect important or critical background sounds (e.g., alarm, horn, directed vocal communications, crying baby, doorbell, telephone, etc.). When a critical background sound is detected, the system interjects either a notification signal or a portion of the ambient background into the audio stream, thus alerting a user of a potentially important sound or event occurring within their immediate vicinity.

30 Claims, 8 Drawing Sheets

INTELLIGENT AMBIENT SOUND MONITORING SYSTEM

FIELD OF THE INVENTION

The present invention relates generally to audio devices and, more particularly, to a system for use with headphones.

BACKGROUND OF THE INVENTION

On a daily basis people are subjected to a variety of noises of varying amplitude, these sources of noise affecting a person's quality of life in a number of ways ranging from simple annoyance to noise induced fatigue and even hearing loss. Common sources of noise include those related to travel, e.g., subway trains, motorcycles, aircraft engine and wind noise, etc., and those related to one's occupation, e.g., factory equipment, chain saws, pneumatic drills, lawn mowers, hedgers, etc.

To help alleviate background noise while providing a source of entertainment, many people listen to music or other audio programming via a set of headphones. Unfortunately, the use of headphones may also lead to problematic, even dangerous situations if the user is unable to hear the various auditory cues and warnings commonly relied upon in day to day living (e.g., warning announcements, sirens, alarms, car horns, barking dogs, etc.). Accordingly, what is needed is a system that provides its users with the benefits associated with headphones without their inherent drawbacks and limitations. The present invention provides such a system.

SUMMARY OF THE INVENTION

An intelligent ambient sound environment monitoring system for use with a set of headphones is provided, the system monitoring the user's ambient sound environment and notifying the user whenever there is a critical sound within the background, thus insuring that the user is aware of his or her environment even if the headphones are noise cancelling headphones or are coupled to an iPod®, MP3 player, CD/DVD player, cell phone, computer or other audio source. In order to determine critical background sounds, a processor (e.g. a DSP) within the system compares the ambient sound environment with a preset set of sound characteristics, where critical background sounds are those determined to match the preset set of sound characteristics. Once a critical background sound is identified, an audio notification signal is output to the headphones, where the audio notification signal may be a simple alarm signal (e.g., a beep or other distinctive tone) or may be comprised of the actual, or a portion of the actual, background environment. In systems in which the headphones are coupled to an audio source, the output from the audio source may be temporarily suspended or the volume of the audio source may be temporarily decreased whenever the audio notification signal is output by the ambient sound monitoring system, thus emphasizing the critical background sounds relative to the audio source output.

In one aspect, the preset set of sound characteristics include at least one frequency signature. The frequency signature typically corresponds to a band of audible frequencies, for example a band of frequencies with a band range of 1500 Hz or less. The preset set of sound characteristics may also include sound amplitude in which case the system may be configured to only output the audio notification signal to the headphones if the sound level corresponding to the critical background sounds exceeds the preset sound amplitude. The preset set of sound characteristics may also include sound duration in which case the system may be configured to only output the audio notification signal to the headphones if the time period corresponding to the critical background sounds exceeds the preset sound duration. The various characteristics included in the preset set of sound characteristics may be input using one or more user accessible switches, e.g., push button switches, slide switches, rotary switches, and touch screen soft buttons.

In another aspect of the invention, a method of interjecting ambient background sounds into a set of headphones is provided, the method including the steps of monitoring the user's ambient sound environment, comparing the ambient sound environment to a preset set of sound characteristics, identifying critical background sounds in which the ambient sound environment matches the preset set of sound characteristics, and interjecting at least a portion of the user ambient environment (e.g., the critical background sounds) into the set of headphones whenever critical background sounds are identified. In some instances, the step of interjecting ambient environment into the headphones is only performed when the sound level of the critical background sounds exceeds a preset sound level, or when the period of time corresponding to the critical background sounds exceeds a preset sound duration. The method may additionally include the steps of identifying ambient noise within the user's ambient sound environment and generating a noise cancellation signal in response to the identified ambient noise. The method may additionally include the step of transmitting an audio stream from an audio source over the headphones, where transmission of the audio stream may be temporarily suspended or the volume of the audio stream may be temporarily decreased whenever the system interjects ambient environment into the headphones.

A further understanding of the nature and advantages of the present invention may be realized by reference to the remaining portions of the specification and the drawings.

DESCRIPTION OF THE SPECIFIC EMBODIMENTS

The present invention overcomes the problems associated with any of a variety of different types of sound isolating headphones by providing an ambient sound monitoring system that allows a user to be aware of select sounds in their environment, sounds that they would otherwise hear if not for the headphones. As used herein, the term "headphones" refers to any of a variety of well-known auditory devices that may be used, for example, to reproduce music or other auditory programming, such devices including, but not limited to, ear buds, in-ear headphones, in-ear monitors, over-the-head headsets/headphones, over-the-ear headsets/headphones, clip-on headsets/headphones and behind-the-neck headsets/headphones. Additionally, and as described further below, the present invention may also be used with sound attenuating headphones and ear plugs, regardless of whether the sound attenuation is due to passive, active or a combination of passive and active noise cancellation.

Figure 1:
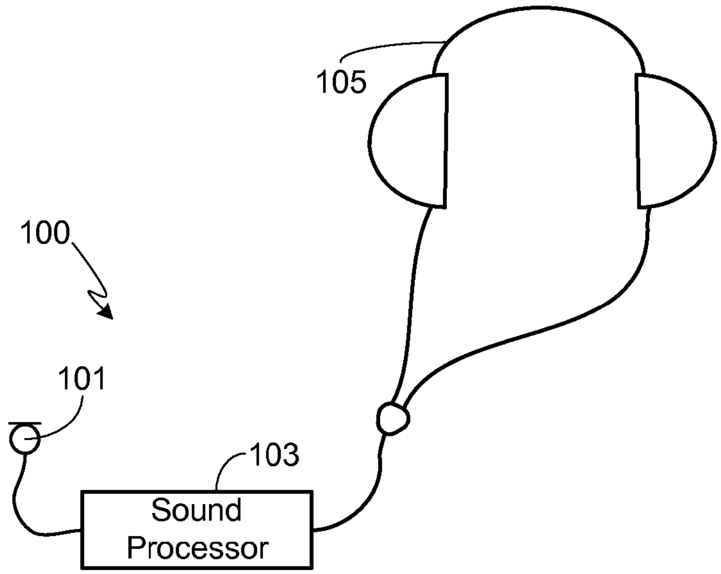
FIG. 1 provides an overview of the ambient sound monitoring system of the invention.

FIG. 1 provides a schematic illustration of the primary components associated with the invention. System 100 monitors a user's ambient sound environment using a microphone 101. Microphone 101 is mounted as close as possible to the user's ear(s), thus insuring that the sound received by microphone 101 is representative of the user's ambient sound environment. Accordingly, in some embodiments of the invention microphone 101 is mounted in the headphones, for example integrated into one of the headphone earcups, headphone or in-ear headphone earpiece, or the headband. In other embodiments, microphone 101 is integrated into the headphone cable. In still other embodiments, system 100 utilizes a microphone 101 that is integrated into a portable or other device such as an iPod®, MP3 player, CD/DVD player, cell phone, tablet/laptop/notebook/desktop computer, smartphone, etc. It should be understood that while a single microphone is shown in the illustrations, the invention may also use multiple microphones, for example a pair of microphones integrated into both earcups. Additionally, while microphone 101 is shown as a wired microphone, the system may also use a wireless microphone.

The sounds received by microphone 101 are processed by sound processor 103 to determine if any of the sounds detected by microphone 101 should be categorized as critical based on a set of predefined criteria. Sounds that are deemed critical are broadcast through headphones 105. Alternately, if a critical sound is detected, the system may be configured to send a warning indicator to the user, for example a series of beeps, thereby signifying to the user that they should remove their headphones so that they may hear the critical sounds.

Figure 2:
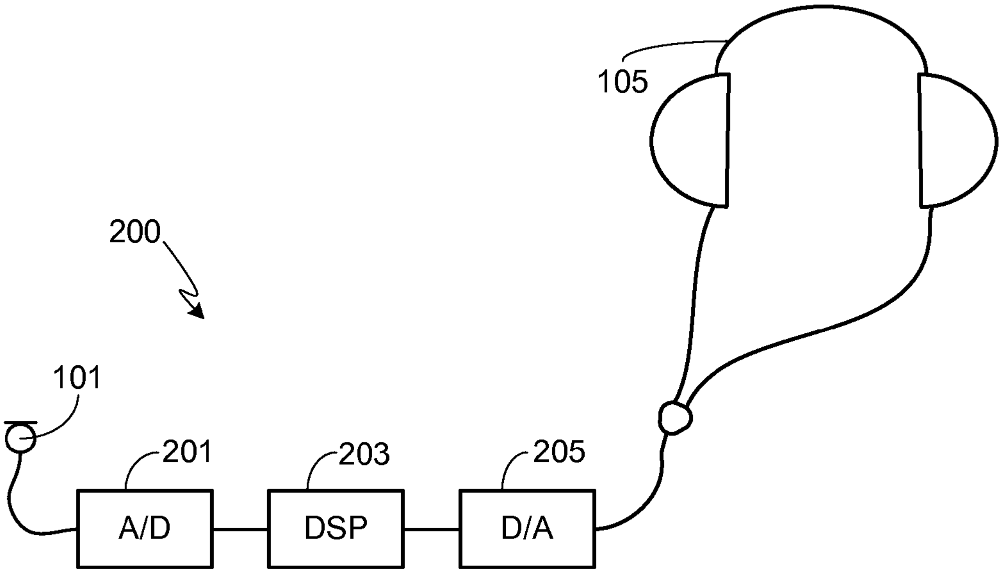
FIG. 2 provides an overview of a digital ambient sound monitoring system in accordance with the invention.

FIG. 2 illustrates a preferred embodiment of the invention. As shown, in system 200 the sounds that are picked-up by microphone 101 are initially digitized using an analog-to-digital (A/D) converter 201. The digital signals representing the detected sound are then passed through to a digital signal processor (DSP) 203. While a DSP is preferred, the DSP algorithms preferably utilized by the present invention may also be performed using a multipurpose processor or microprocessor such as those commonly used in a tablet, smartphone or laptop computer. As described in detail below, DSP 203 utilizes a DSP algorithm to determine, based on predefined criteria, whether to categorize any of the detected sounds as critical. Sounds that are categorized as critical are then passed through a digital-to-analog (D/A) converter 107 and broadcast through headphones 105. Alternately, and as previously noted, once a critical sound is detected the system may also be configured to send a warning indicator to the user, thereby alerting the user that a critical sound has been identified.

Figure 3:
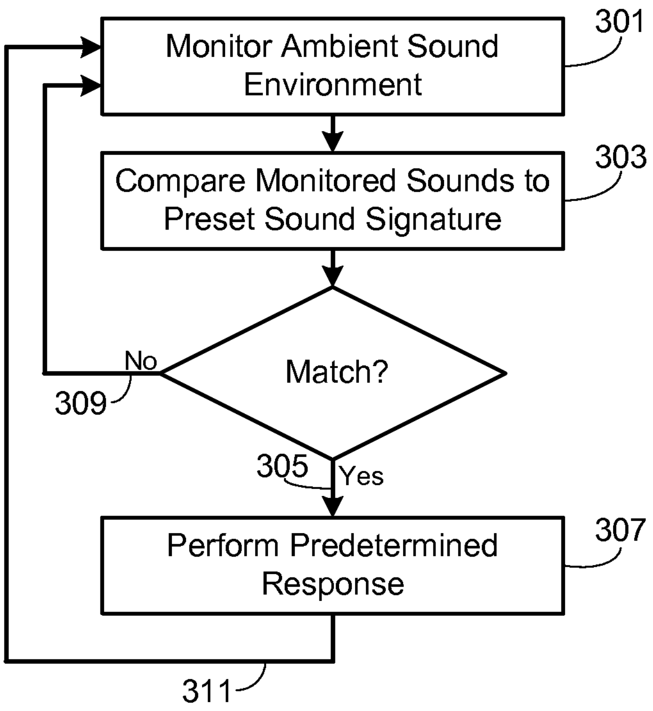
FIG. 3 illustrates one process for determining whether the monitored ambient environment contains any critical sounds.

FIG. 3 illustrates the primary steps associated with the algorithm, preferably a DSP algorithm, applied to the sounds detected by microphone 101. After the sounds from the user's ambient environment are detected by microphone 101 and preferably digitized (step 301), the sounds are compared to one or more preset sound signatures that are associated with the sounds deemed to be critical (step 303). Note that a critical sound, as used herein, simply refers to any sound that the user wishes to hear, or be notified of, and is therefore not limited to a sound that may be important from a safety standpoint. For example, while the preset sound signature may correspond to an alarm or siren, the preset sound signature(s) may also correspond to human speech, a ringing telephone, a crying baby, a barking dog, a horn, or any other sound. Note that the preset sound signature(s) may be preset by the system manufacturer, by a third party provider, or by the user. The preset sound signature(s) may also be learned, thus allowing the system to distinguish between similar, but different, sound signatures. For example, by utilizing a learning function to analyze a sound and then use the analyzed sound for the preset, the system is able to distinguish between different voices (e.g., a spouse versus someone else), different ring tones (e.g., the user's phone versus other phones), different dogs (e.g., the user's dog versus other dogs), etc.

The present invention may utilize any of a variety of sound recognition algorithms of varying complexity. As sound recognition algorithms are well known by those of skill in the art, a detailed explanation is not provided herein. In the simplest configuration of the invention, once DSP 203 detects a match between the monitored sound and a preset sound signature (step 305), the system performs a preset response such as passing the detected sounds or a notification tone through to the user via headphones 105 (step 307). The detection and monitoring process continues (steps 309 and 311) for as long as the user is utilizing headphones 105; alternately, until the user terminates the monitoring process.

Figure 4:
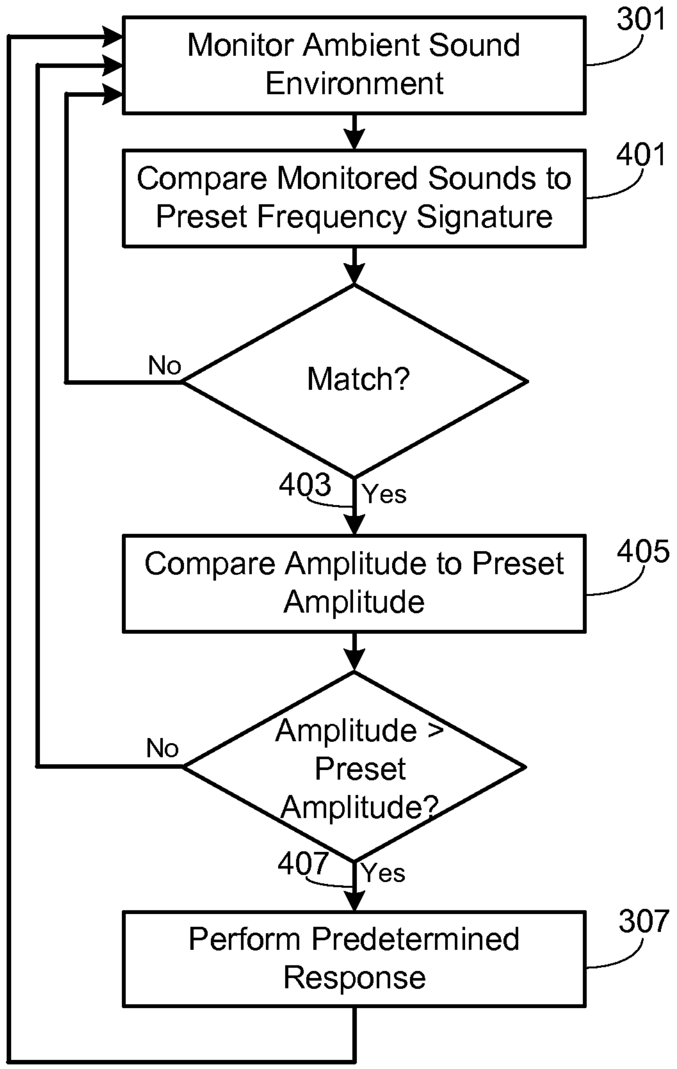
FIG. 4 illustrates a process based on the process shown in FIG. 3, modified to use sound volume in addition to frequency as a means of differentiating critical sounds from background noise.

The detection algorithm may utilize a variety of characteristics to identify a preset sound signature from the ambient environment. For example, the system may use both the frequency spectrum and the corresponding sound levels, also referred to as sound amplitudes, to distinguish critical sounds from those of the general background. This is quite similar to the way in which a person will often use sound levels to determine the urgency associated with a particular sound. For example, the volume of an alarm can be used to determine the proximity, and thus the urgency, of an alarm or siren. Similarly, the volume of speech can be used to distinguish general background speech (i.e., background chatter) from speech that may be directed at the listener. FIG. 4 illustrates a modification of the process shown in FIG. 3 in which sound levels are used in addition to frequency signatures. As shown, DSP 203 compares the monitored sound with a preset frequency signature (step 401) and once a match has been detected (step 403), the DSP then compares the amplitude of the detected sound to a preset sound level (step 405). The preset sound level may be a simple baseline level over which sounds are assumed to be critical. Alternately, the preset sound level may be based on an average or background sound level detected by microphone 101. Applying this algorithm, once a monitored sound is determined to match the preset frequency signature (step 403) and be of an amplitude greater than the preset level (step 407), the system performs the preset response (step 307).

Figure 5:
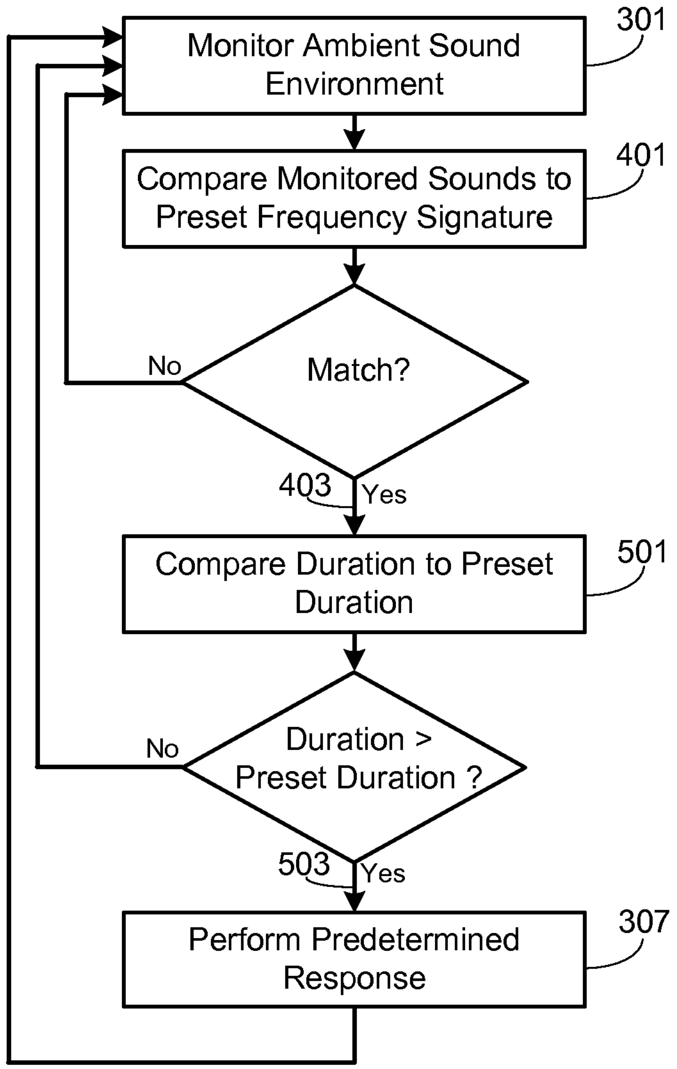
FIG. 5 illustrates a process based on the process shown in FIG. 3, modified to use sound duration in addition to frequency as a means of differentiating critical sounds from background noise.

Sound duration is another key metric that may be used by the system to determine if a detected sound should be deemed critical. Sound duration helps the DSP to distinguish between short duration sounds that may match the preset sound signature (e.g., a sneeze) from similar, more important sounds (e.g., flight attendant asking the user a question or providing instructions, an alarm, etc.). This modification of the algorithms of FIGS. 3 and 4 is illustrated in FIG. 5. As shown, once DSP 203 detects a match between the monitored sound and a preset frequency signature (step 403), the DSP then compares the duration of the detected sound to a preset time such as 0.5 seconds, 1 second, 5 seconds, etc. (step 501). Applying this algorithm, once a monitored sound is determined to match the preset frequency signature (step 403) and be of a duration greater than the preset time period (step 503), the system performs the preset response (step 307).

Figure 6:
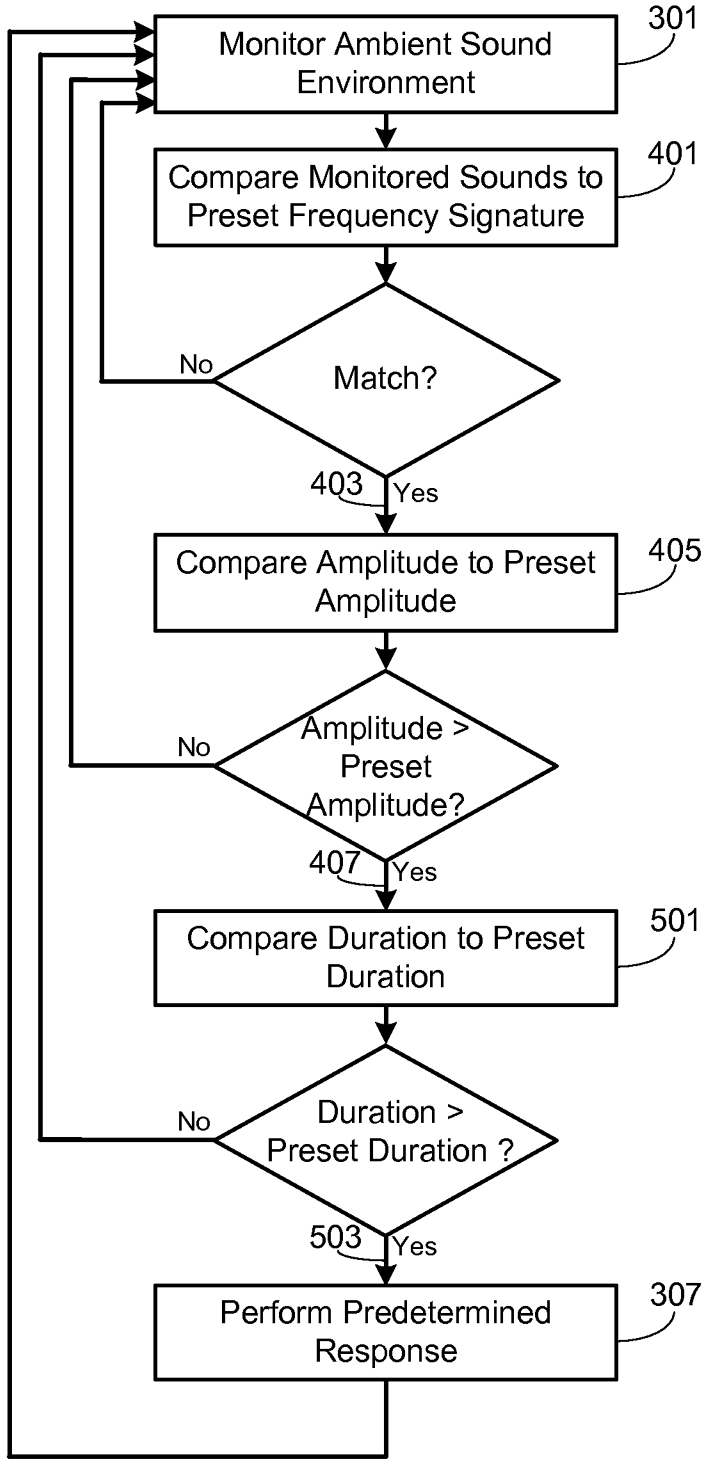
FIG. 6 illustrates a sound identification process based on frequency, duration and amplitude.
Figure 7:
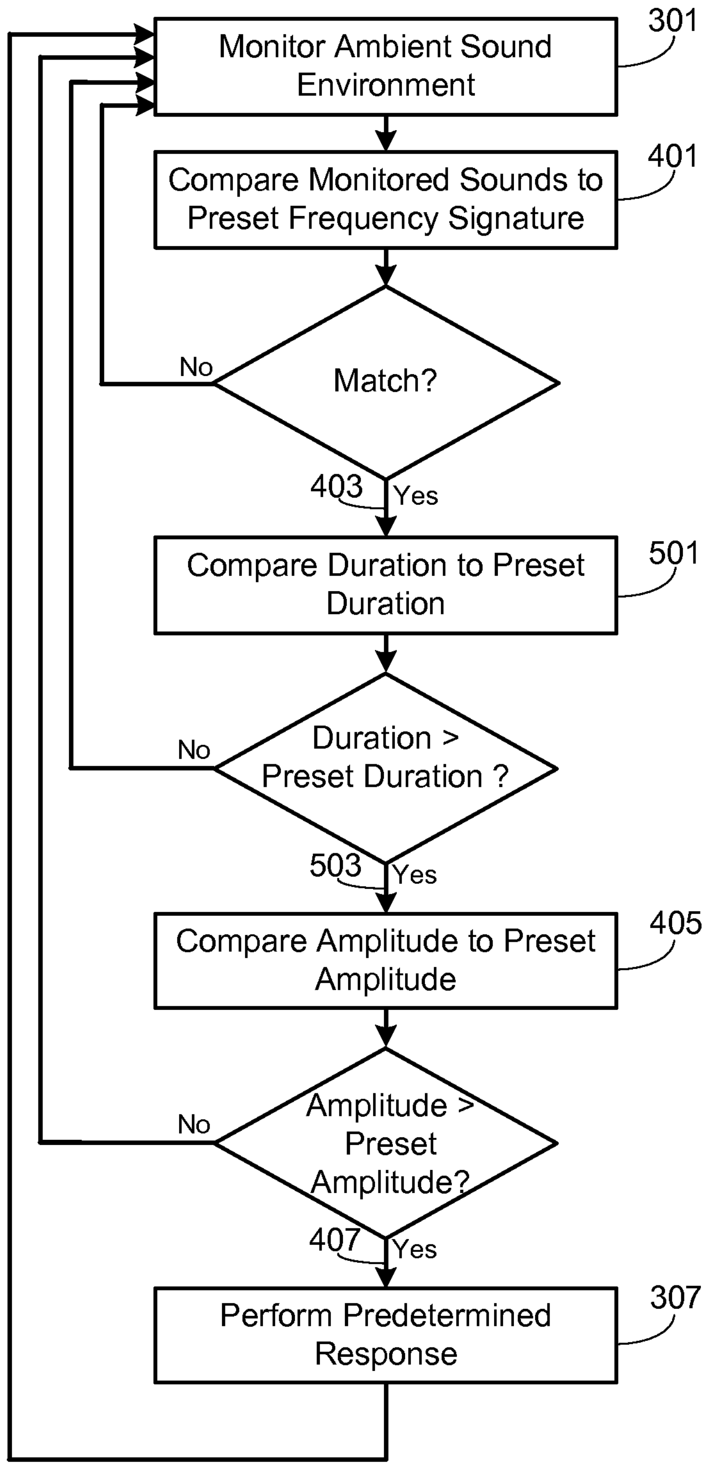
FIG. 7 illustrates a minor modification of the sound identification process shown in FIG. 6.

It will be appreciated that frequency signature, amplitude and duration may be applied in other combinations, and other orders, than those illustrated in FIGS. 3-5. For example, FIG. 6 illustrates a process in which frequency spectrum, amplitude and duration are all used in determining whether or not to classify a sound as critical or not. FIG. 7 utilizes the same criteria, but in a different order.

As described above, in general when systems 100/200 determine that the background includes a critical sound of which the listener should be aware, the system can either transmit a notification/alarm signal to the user, or pass the background sound on to the user via headphones 105. In the former case, the notification (i.e., alarm) signal may be a distinctive tone such as a beep, a series of beeps, or some other sound effect that is designed to get the user's attention. The intent of the notification/alarm is to notify the user to look around and be aware of their surroundings, possibly even removing their headphones if deemed necessary. In the alternate case in which the background sound is passed on to the user, the system may be configured in a number of ways. For example, once background sound is determined to be critical, everything that is detected by microphone 101 may be passed through to the user via headphones 105. Alternately, systems 100/200 may use filters to only pass a narrow band of frequencies on to the user, this band including the critical sounds. For example, if the critical sounds are located between 2500 and 3500 Hz, frequencies outside of this range may be filtered out. In an embodiment in which headphones 105 are not just sound attenuating headphones but are instead coupled to an audio source, in a preferred embodiment the system is configured to automatically lower the volume or completely suppress the signal from the audio source when the critical sound is passed through to the user, thus emphasizing the critical sound over the user's audio source. Preferably the length of time that the system passes background sounds through to the user is also configurable. Typically the system is either configured to terminate passage of background sounds to the user after they are no longer deemed critical. Alternately, the system may be configured to pass background sounds to the user for a preset period of time (e.g., 30 seconds, 1 minute, 3 minutes, etc.) after the initial critical event is detected, or after the critical event ceases.

As noted above, various aspects and features of the present invention may be configured to optimize performance for a particular user or segment of users. System configuration may be performed by the manufacturer, thus allowing the manufacturer to offer different models with different capabilities and functionality. Alternately, some or all aspects of the system may be configurable by the user. For example, if the system is integrated into a set of over-the-ear headphones, the user-configurable parameters may be adjusted via any of a variety of switch types (e.g., push buttons, slide switches, rotary switches, etc.) built into one or both headphone earcups. Alternately, the switches used to adjust the user-configurable parameters may be built into a small housing attached to the headphones by a lanyard or integrated into the headphones' audio cable. This latter configuration is especially useful if the headphones are comprised of in-ear headphones or earbuds that may not have sufficient space to accommodate the necessary switches to provide user adjustability. Alternately, the switches used to adjust the user-configurable parameters may be accessible via a software/computer interface, this configuration being useful regardless of whether the processing is not locally, e.g., within the hardware associated with the headphones, or remotely, e.g., a cloud-based system.

It will be appreciated that if the ambient sound monitoring system of the invention is user configurable, or at least partially user configurable, preferably the controls are simplified to promote the user experience. For example, while the user can be presented with various frequency bands for system monitoring (e.g., 1000 to 2000 Hz, 2000 to 3500 Hz, etc.), in at least one embodiment the user is given descriptive terms that may be easier for the user to relate to than different frequencies. Exemplary descriptive terms include "crying baby", "speech", "alarm", "horn", and "barking dog". It should be understood that these are just examples of possible terms that may be used to describe different frequency bands or sound signatures that may be of interest for a particular user and/or segment of users. Similarly, critical sound amplitude may be presented to the user in a range from "soft" to "loud" and duration may be presented to the user in a range from "short" to "long".

Figure 8:
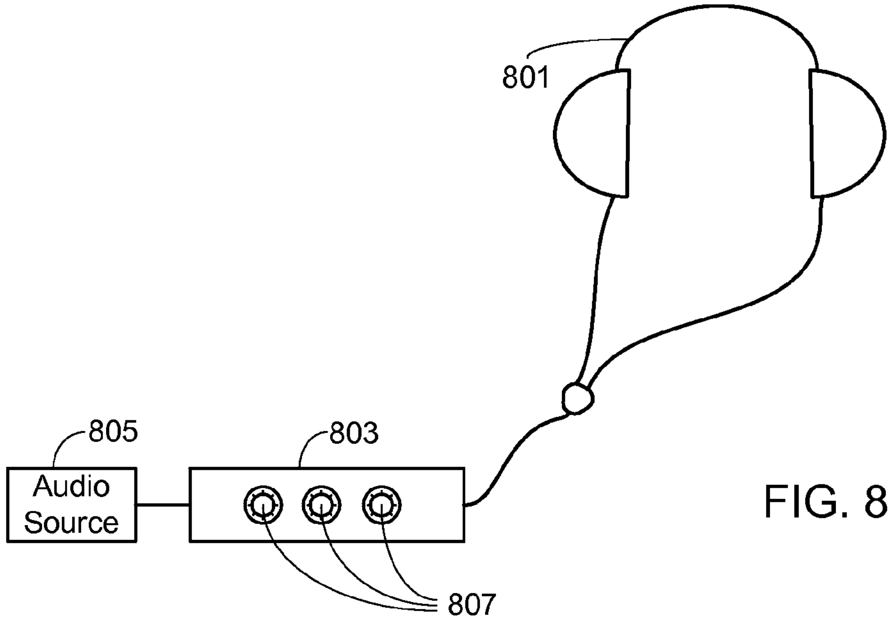
FIG. 8 illustrates an embodiment of the ambient sound monitoring system of the invention in which the monitoring system is separate from the headphones.

In addition to integrating the ambient sound monitoring system of the invention into a set of headphones, either directly or in a housing mounted to a lanyard or the audio cable, the system may also be configured as a separate device. Configuring the system as a separate device with its own housing provides greater flexibility, for example allowing the user to switch the device between multiple headphones or replace a set of headphones without having to replace the ambient sound monitoring system. This embodiment is illustrated in FIG. 8 in which headphones 801 are plugged into a jack of ambient sound monitoring system 803. Ambient sound monitoring system 803 is then plugged into, or otherwise coupled to, audio source 805. In a preferred embodiment, sound monitoring system 803 includes one or more switches 807 that allow the user to configure operation of the system as described above.

Figure 9:
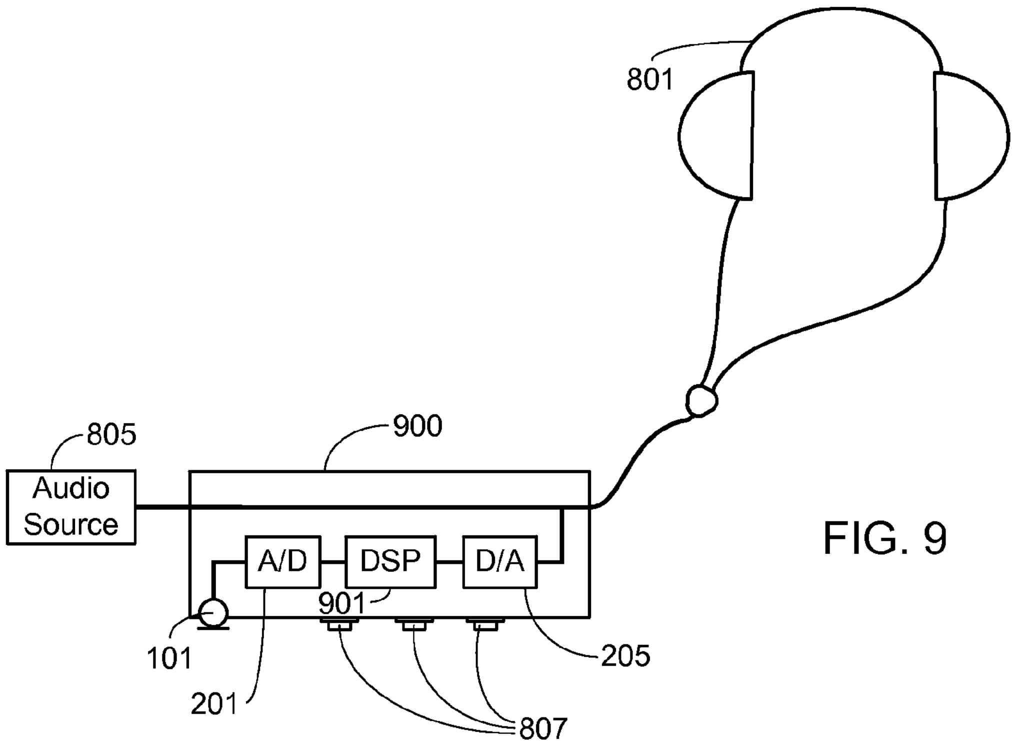
FIG. 9 illustrates the primary components associated with the embodiment shown in FIG. 8.
Figure 10:
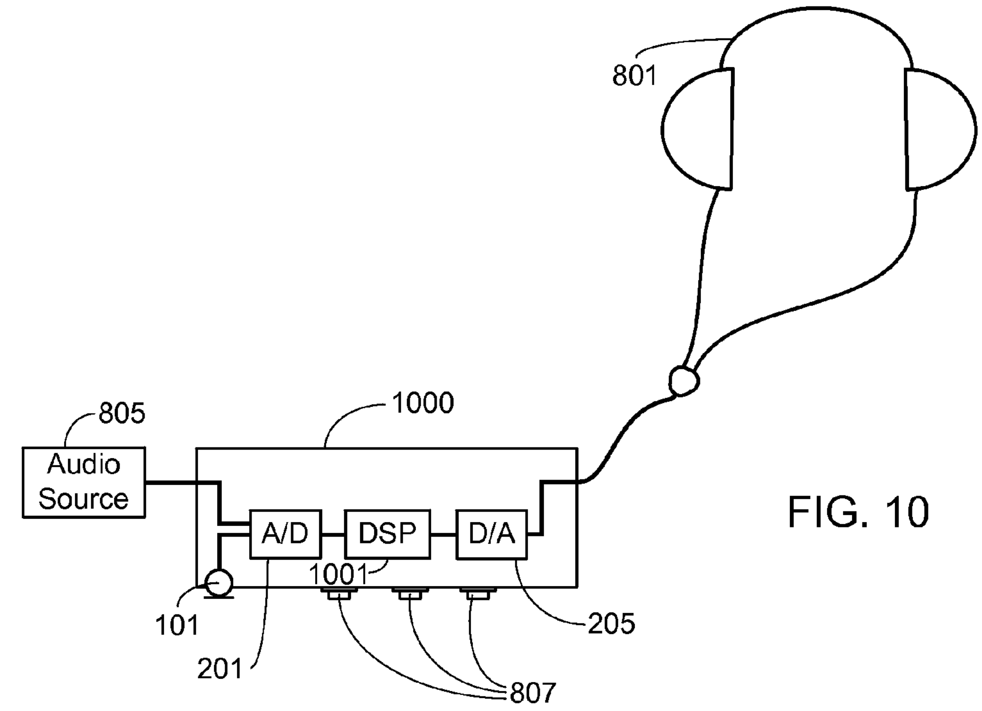
FIG. 10 illustrates an alternate configuration of the embodiment shown in FIG. 9.
Figure 11:
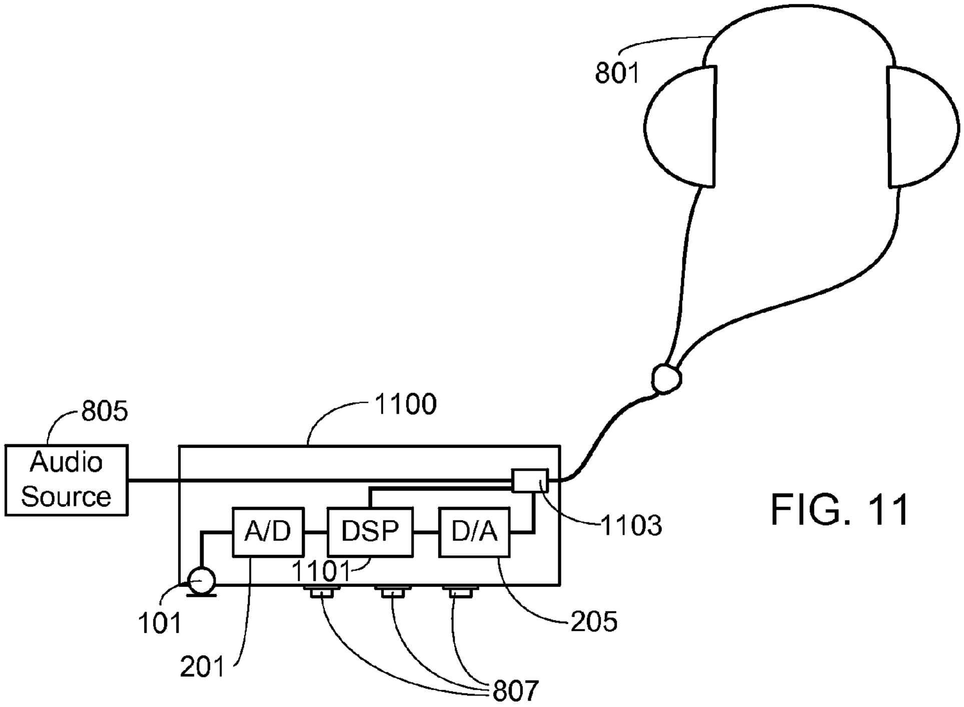
FIG. 11 illustrates an alternate configuration of the embodiment shown in FIG. 9.

A stand-alone sound monitoring system such as that shown in FIG. 8 may be configured in a number of ways. For example and as illustrated in FIG. 9, in one configuration the output from source 805 passes untouched and unprocessed through sound monitoring system 900. When DSP 901 detects a critical sound, in accordance with the preset system rules either a notification/alarm signal or the background sound is added on top of the output from source 805. Thus, for example, if the user is listening to a particular song, the notification/alarm signal or the background sound will be added to that song (i.e., played on top of the user's selection). FIG. 10 illustrates an alternate configuration in which the output of source 805 passes through DSP 1001. Typically in order for the signal from source 805 to pass through DSP 1001, it must first be digitized, although clearly that depends upon the output from source 805. FIG. 10 assumes that the output from source 805 is an analog signal and therefore the signal path from source 805 is shown first passing through A/D converter 201, then DSP 1001, then D/A converter 205. In this embodiment, as long as system 1000 does not detect a critical sound, DSP 1001 does not alter the signal from source 805. When, however, a critical sound is detected, DSP 1001 reduces the amplitude of the signal from source 805 while adding either the notification/alarm signal or the critical background sound into the audio stream to the user. This approach insures that the detected critical sound does not go unheard and un-noticed by the user by making sure that the critical sound is not overpowered by the output from source 805. FIG. 11 illustrates another configuration that accomplishes this same goal. In this embodiment, in addition to being used to detect critical sounds in the monitored background, DSP 1101 (or other processor) also controls a switch 1103. As long as no critical sounds are detected, DSP 1101 controls switch 1103 to allow the signal from source 805 to pass unprocessed through to headphones 801. When a critical sound is detected, DSP 1101 controls switch 1103 to pass the notification/alarm signal (or the background sound, depending upon the configuration) through to headphones 801. Switch 1103 may be designed to pass either one signal or the other, i.e., the audio source signal or the signal from the ambient sound monitoring system. Alternately switch 1103 may be designed so that when the signal path from the ambient sound monitoring system is selected, an attenuated signal from source 805 is also passed onto headphones 801, signal attenuation preferably being provided by inserted a fixed or user adjustable resistance in the signal line from source 805.

In the systems illustrated in FIGS. 8-11, the ambient sound monitoring system is shown as being separate from the audio source. In at least one preferred embodiment of the invention, however, these two components are combined into a single device. Such an embodiment takes advantage of both the processing power and the microphone built into many of the components commonly used to listen to music, these components including both dedicated music players as well as multifunction devices such as cell phones/smart phones, personal data assistants (PDAs), gaming systems and computers (e.g., tablet, laptop, notebook, ultrabook and desktop computers). For most of these devices a simple application can be downloaded to the device to enable it to perform the functions of the present invention. In those devices that do not include a built-in microphone, for example some desktop computers, a microphone may be coupled to the device.

As previously noted, the ambient sound monitoring system of the present invention is equally applicable to simple sound isolation headphones as well as those that are intended to be coupled to an audio source (e.g., MP3/CD/DVD player, etc.). In the former case the invention may be used with either passive or active sound isolation headphones. If the sound isolation headphones are active, preferably the system of the invention utilizes the same components as those required for the active noise cancellation system, simply modified to also perform the functions of the invention as described in detail above. If, however, the sound isolation headphones are passive, it will be appreciated that the headphones must be modified to include not only a microphone (e.g., microphone 101), but also the necessary processor and related hardware (e.g., an A/D converter, a DSP and a D/A converter) as well as a driver. While either a diaphragm driver or an armature driver may be used, typically the selection is based on the size and weight constraints placed on the system by the type of isolation system. For example, in a typical over-the-ear headphone style there is plenty of space available for integration of the entire ambient sound monitoring system of the invention, including one or more drivers (i.e., typically either one driver per headphone set or one driver per ear). In an earplug design where there is very limited space, the ambient sound monitoring system is typically contained within a housing attached to the earplugs via a lanyard and/or audio cable, with miniature armature drivers preferably being used in the earplugs.

It should be understood that identical element symbols used on multiple figures refer to the same component, or components of equal functionality. Additionally, the accompanying figures are only meant to illustrate, not limit, the scope of the invention and should not be considered to be to scale.

Systems and methods have been described in general terms as an aid to understanding details of the invention. In some instances, well-known structures, materials, and/or operations have not been specifically shown or described in detail to avoid obscuring aspects of the invention. In other instances, specific details have been given in order to provide a thorough understanding of the invention. One skilled in the relevant art will recognize that the invention may be embodied in other specific forms, for example to adapt to a particular system or apparatus or situation or material or component, without departing from the spirit or essential characteristics thereof. Therefore the disclosures and descriptions herein are intended to be illustrative, but not limiting, of the scope of the invention.

What is claimed is:

1. An ambient sound monitoring system, comprising:

a microphone, said microphone monitoring an ambient sound environment;

a set of headphones; and a processor, said processor receiving a microphone output from said microphone, wherein said processor compares said microphone output to a preset set of sound characteristics and identifies critical background sounds within said ambient sound environment, said critical background sounds corresponding to a match between said microphone output and said preset set of sound characteristics, wherein said processor outputs an audio notification to said set of headphones only when said critical background sounds are identified, wherein said preset set of sound characteristics comprises at least one frequency signature, and wherein said audio notification is selected from the group consisting of an alarm signal and at least a portion of said ambient sound environment.

2. The ambient sound monitoring system of claim 1, wherein said microphone output is processed prior to being received by said processor.

3. The ambient sound monitoring system of claim 1, further comprising an analog-to-digital (A/D) converter interposed between said microphone and said processor, and a digital-to-analog (D/A) converter interposed between said processor and said set of headphones.

4. The ambient sound monitoring system of claim 1, wherein said at least one frequency signature corresponds to a band of audible frequencies.

5. The ambient sound monitoring system of claim 4, wherein said band of audible frequencies has a band range of less than 1500 Hz.

6. The ambient sound monitoring system of claim 1, further comprising at least one user accessible switch, wherein said at least one frequency signature is user selectable via said at least one user accessible switch, and wherein said at least one user accessible switch is selected from the group consisting of push button switches, slide switches, rotary switches, and touch screen soft buttons.

7. The ambient sound monitoring system of claim 1, wherein said preset set of sound characteristics further comprises a sound amplitude.

8. The ambient sound monitoring system of claim 7, wherein said processor outputs said audio notification to said set of headphones when an ambient sound level corresponding to said critical background sounds exceeds said sound amplitude.

9. The ambient sound monitoring system of claim 7, further comprising at least one user accessible switch, wherein said sound amplitude is user selectable via said at least one user accessible switch, and wherein said at least one user accessible switch is selected from the group consisting of push button switches, slide switches, rotary switches, and touch screen soft buttons.

10. The ambient sound monitoring system of claim 1, wherein said preset set of sound characteristics further comprises a sound duration.

11. The ambient sound monitoring system of claim 10, wherein said processor outputs said audio notification to said set of headphones when a period of time corresponding to said critical background sounds exceeds said sound duration.

12. The ambient sound monitoring system of claim 10, further comprising at least one user accessible switch, wherein said sound duration is user selectable via said at least one user accessible switch, and wherein said at least one user accessible switch is selected from the group consisting of push button switches, slide switches, rotary switches, and touch screen soft buttons.

13. The ambient sound monitoring system of claim 1, wherein said alarm signal corresponds to a distinctive tone.

14. The ambient sound monitoring system of claim 1, wherein said audio notification corresponds to a subset of said ambient sound environment, said subset corresponding to said critical background sounds.

15. The ambient sound monitoring system of claim 1, wherein said set of headphones is selected from the group consisting of ear buds, in-ear headphones, in-ear monitors, over-the-head headsets, over-the-head headphones, over-the-ear headsets, over-the-ear headphones, clip-on headphones, behind-the-neck headsets and behind-the-neck headphones.

16. The ambient sound monitoring system of claim 1, further comprising an active noise cancellation system.

17. The ambient sound monitoring system of claim 1, wherein said set of headphones are coupleable to an audio source, wherein said set of headphones are configured to output an audio stream based on an output from said audio source.

18. The ambient sound monitoring system of claim 17, wherein said audio source is temporarily suspended when said processor outputs said audio notification to said set of headphones.

19. The ambient sound monitoring system of claim 17, wherein a volume corresponding to said audio source is decreased when said processor outputs said audio notification to said set of headphones.

20. The ambient sound monitoring system of claim 1, further comprising a computer, wherein said set of headphones is coupleable to said computer, wherein said microphone and said processor are integrated into said computer, and wherein said computer is selected from the group consisting of tablet computers, notebook computers, laptop computers, ultrabook computers, netbook computers and desktop computers.

21. The ambient sound monitoring system of claim 1, further comprising a portable device, wherein said set of headphones is coupleable to said portable device, wherein said microphone and said processor are integrated into said portable device, and wherein said portable device is selected from the group consisting of personal digital assistants, cell phones, smart phones, MP3 players, CD players, DVD players, and music players.

22. A method of interjecting ambient background sounds into a set of headphones, the method comprising the steps of:

monitoring an ambient sound environment;

comparing said ambient sound environment to a preset set of sound characteristics, wherein said preset set of sound characteristics comprises at least one frequency signature;

identifying critical background sounds, wherein said critical background sounds correspond to a match between said ambient sound environment and said preset set of sound characteristics; and interjecting at least a portion of said ambient sound environment into said set of headphones when said critical background sounds are identified.

23. The method of claim 22, wherein said interjecting step is performed when an ambient sound level corresponding to said critical background sounds exceeds a preset sound amplitude.

24. The method of claim 22, wherein said interjecting step is performed when a period of time corresponding to said critical background sounds exceeds a preset sound duration.

25. The method of claim 22, wherein said portion of said ambient sound environment corresponds to said critical background sounds.

26. The method of claim 22, further comprising the steps of identifying an ambient noise within said ambient sound environment and generating a noise cancellation signal in response to said ambient noise, wherein said noise cancellation signal is transmitted over said set of headphones.

27. The method of claim 22, further comprising the step of transmitting an audio stream from an audio source over said set of headphones.

28. The method of claim 27, further comprising the step of temporarily suspending said transmitting step whenever said interjecting step is performed.

29. The method of claim 27, further comprising the step of lowering an audio volume corresponding to said audio stream whenever said interjecting step is performed.

30. The method of claim 22, further comprising the step of performing said interjecting step for a preset period of time each time said interjecting step is performed.

* * * * *